United States Patent [19]

Fumitomo

[11] Patent Number: 5,766,823
[45] Date of Patent: Jun. 16, 1998

[54] METHOD OF MANUFACTURING SEMICONDUCTOR DEVICES

[75] Inventor: Matsuoka Fumitomo, Kawasaki, Japan

[73] Assignee: Kabushiki Kaisha Toshiba, Tokyo, Japan

[21] Appl. No.: 935,058

[22] Filed: Sep. 22, 1997

Related U.S. Application Data

[63] Continuation of Ser. No. 373,121, Dec. 23, 1994, abandoned.

[30] Foreign Application Priority Data

Dec. 27, 1993 [JP] Japan ................................ 5-333195

[51] Int. Cl.$^6$ ........................ G03C 5/00; G03F 7/36
[52] U.S. Cl. ................... 430/314; 430/317; 430/329; 156/652.1; 156/559.11; 156/661.11; 438/221; 438/761; 438/787
[58] Field of Search ........................ 430/313, 317, 430/329; 156/659.11, 661.11; 438/221, 761, 787

[56] References Cited

U.S. PATENT DOCUMENTS

| | | | |
|---|---|---|---|
| 4,666,556 | 5/1987 | Fulton et al. | 437/72 |
| 5,290,664 | 3/1994 | Matsumoto | 430/314 |
| 5,360,697 | 11/1994 | Mehra | 430/314 |
| 5,413,966 | 5/1995 | Schoenborn | 437/225 |

FOREIGN PATENT DOCUMENTS

| | | |
|---|---|---|
| 0048175 | 3/1982 | European Pat. Off. . |
| 0113517 | 7/1984 | European Pat. Off. . |
| 0349107 | 1/1990 | European Pat. Off. . |

OTHER PUBLICATIONS

"Dielectric Isolation Using a High–Resputtering Deposition", Lechaton et al., IBM Technical Disclosure Bulletin, vol. 18, No. 2, Jul. 1975, New York, US, pp. 382–383, XP 002017906.

"Optimized Shallow Trench Isolation Structure. . .", IBM Technical Disclosure Bulletin, vol. 34, No. 11, Apr. 1992, New York, US, pp. 276–277, XP 000303261.

"A Highly Manufacturable Trench Isolation Process. . .", Fazan et al., IEDM 93, pp. 57–60, Dec. 5, 1993, XP 000481568.

"A Deep–Submicron Isolation Technology with T-Shaped Oxide. . .", Ishijima et al., International Electron Devices Meeting, San Francisco,CA, US, Dec. 9–12, 1990, pp. 257–260, XP 000279565.

*Primary Examiner*—Christopher G. Young
*Attorney, Agent, or Firm*—Loeb & Loeb LLP

[57] ABSTRACT

Buried type element separating trenches suitable for microminiaturization of semiconductor circuits can be formed. In addition, defects that generate electric field concentration and gate oxide film leakage due to the shape of the element separating trenches can be prevented effectively. The method of manufacturing a semiconductor device includes the steps of: forming a first material layer and a second material layer in sequence on a surface of a semiconductor substrate; forming a first opening on the first material layer and a second opening in the second material layer (the first opening being larger than the second opening); forming an element separating trench under the second opening in the substrate by using the second material layer as a mask; removing the second material layer; depositing a filling material on the element separating trench, the substrate and the first material layer; and etching back the filling material by using the first material layer as a stopper. In the above-mentioned process, the filling material remains over and about the element separating trench so as to cover the edge portion between the substrate surface and the separating trench, thus eliminating the edge portion which causes defects.

18 Claims, 6 Drawing Sheets

METHOD OF MANUFACTURING SEMICONDUCTOR DEVICES

This is a continuation of application Ser. No. 08/373,121 filed Dec. 23, 1994, now abandoned.

FIELD OF THE INVENTION

The present invention relates to a method of manufacturing semiconductor devices, and more specifically to a method of manufacturing semiconductor devices having buried element separating regions.

BACKGROUND OF THE INVENTION

Recently, with the advance of the microminiaturization of the semiconductor integrated circuit devices, the distance between element separating regions has become narrower and narrower for each generation. To cope with the narrower element separating regions, the buried element separation has been developed.

FIGS. 3(A) to 3(D) are cross-sectional views for assistance in explaining the conventional method of manufacturing the buried element separating region, in particular.

First, as shown in FIG. 3(A), a $SiO_2$ film 2 with a thickness of about 10 nm, for instance is formed on a Si substrate by thermal oxidization.

Then, a resist film 5 is applied onto the $SiO_2$ film 2, and further the resist film 5 is formed into a predetermined shape in accordance with photolithography. Further, by using the formed resist film 5 as a mask, an element separating trench 7 with a depth of about 500 nm, for instance is formed in the $SiO_2$ film 2 and the Si substrate by anisotropic etching.

Successively, as shown in FIG. 3(B), to eliminate damage caused by etching, another $SiO_2$ film 8 with a thickness of about 20 nm, for instance is deposited thereon by thermal oxidization. After that, another $SiO_2$ 9 film with a thickness of about 1 μ, for instance is further deposited thereon as a trench filling substance.

Further, as shown in FIG. 3(C), the deposited filling substance of the $SiO_2$ film 9 is etched back by anisotropic etching or polishing to complete the buried element separating region 10.

Further, as shown in FIG. 3(D), after the ion implantation process to control the threshold value of a MOSFET, a gate oxide film 11 with a thickness of about 10 nm is formed thereon by thermal oxidization. Further, a poly crystalline Si film 12 with a thickness of about 300 nm, for instance is formed into a predetermined shape as a gate electrode.

In the above-mentioned conventional method of manufacturing the buried element separating region 10, since a process margin must be taken into account in the etching back process shown in FIG. 3(C), a predetermined overetching is inevitably required in FIG. 3(C), with the result that the surface of the buried element separating region 10 is formed being slightly recessed from the surface of the Si substrate 1. Therefore, as shown in FIG. 3(D), an edge portion 13 remains at the buried element separating region 10, so that the gate oxide film 11 formed thereon is also formed with an edge portion 13.

As described above, in the conventional method of manufacturing the semiconductor device, since a stepped portion is generated at the edge portion 13 of the buried element separating region 10 and thereby also at the edge portion of the gate oxide film 11 in the same way, an electric field is inevitably concentrated at this edge portion 13 of the buried element separating region 10.

Once the electric field concentration occurs as described above, the characteristics between gate voltage and drain current deteriorate, as shown by a solid line curve in FIG. 4, which is referred to as kink characteristics in comparison with the normal characteristics as shown by dashed lines. The kink characteristics occur because the characteristics of a parasitic transistor are added to the original I-V characteristics of the MOSFET.

On the other hand, since the edge portion 13 is a corner of the Si substrate as shown in FIG. 3(D), a mechanical stress tends to be concentrated and thereby a defect tends to occur easily at the edge portion 13, thus causing a problem in that a leakage tends to occur in the gate oxide film 11.

SUMMARY OF THE INVENTION

Accordingly, it is the object of the present invention to provide a method of manufacturing semiconductor devices, which can realize buried element separations suitable for microminiaturized integrated circuits, without forming defects which may cause electric field concentration and gate oxide film leakage.

To achieve the above-mentioned object, the present invention (FIGS. 2(A) to 2(G)) provides a method of manufacturing a semiconductor device, comprising the steps of: forming a first material layer (3) and a second material layer (5) in sequence on a surface of a semiconductor substrate (1); forming a first opening on the first material layer (3) and a second opening in the second material layer (5), the first opening being larger than the second opening; forming an element separating trench (7) under the second opening in the substrate (1) by using the second material layer (5) as a mask; removing the second material layer (5); depositing a filling material (9) on the element separating trench (7), the substrate (1) and the first material layer (3); and etching back the filling material (9) by using the first material layer (3) as a stopper.

Further, the present invention FIGS. 2(A) to 2(G) provides a method of manufacturing a semiconductor device, comprising the steps of: forming a first material layer (3), a second material layer (4), and a third material layer (5) on a surface of a semiconductor substrate (1); patterning the third material layer (5); etching the second and the first material layers (4, 3) by using the third material layer (5) as a mask to form a first opening on the first material layer (3) and a second opening in the second material layer (4), the first opening being larger than the second opening; forming an element separating trench (7) under the second opening in the substrate (1) by using the second material layer (4) as a mask; removing the second material layer (4); depositing a filling material (9) on the element separating trench (7), the substrate (1) and the first material layer (3); and etching back the filling material (9) by using the first material layer (3) as a stopper.

In the manufacturing method according to the present invention, since the first opening of the first layer deposited on the semiconductor substrate is determined to be broader than the opening of the element separating trench formed on the semiconductor substrate, it is possible to cover the edge portion (formed between the substrate surface and the element separating trench) with a filling substance deposited in the trench and on the surface of the semiconductor substrate. As a result, it is possible to eliminate defects which may cause the electric field concentration and the gate oxide film leakage at the edge portion.

DETAILED DESCRIPTION OF PREFERRED EMBODIMENTS

Preferred embodiments of the present invention will be described hereinbelow with reference to the attached drawings.

[First embodiment]

FIGS. 1(A) to 1(G) show a first embodiment of a manufacturing method according to the present invention.

Figure 1A:
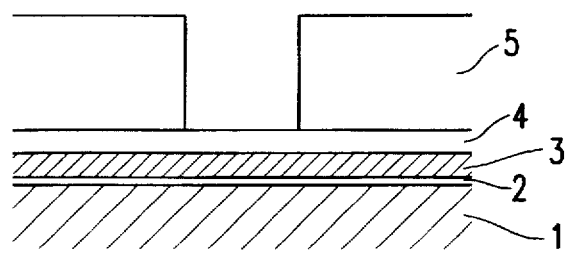
FIGS. 1(A) to 1(G) are cross-sectional views for assistance in explaining a first embodiment of the method of manufacturing semiconductor devices.

First, as shown in FIG. 1(A), a $SiO_2$ film 2 with a thickness of about 10 nm, for instance, is formed on a Si substrate 1 by thermal oxidation. Then, a polycrystalline Si film 3 with a thickness of about 200 nm, for instance, is deposited by chemical vapor deposition. Further, a $SiO_2$ film 4 with a thickness of about 200 nm, for instance, is deposited thereon by chemical vapor deposition. After that, a resist film 5 is applied onto the $SiO_2$ film 4, and then the resist film 5 is formed into a predetermined shape in accordance with photolithography.

Figure 1B:
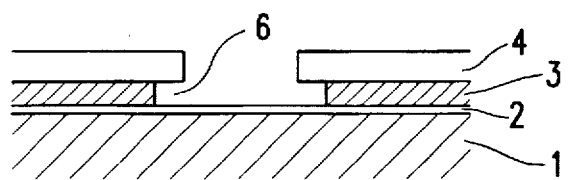

Further, as shown in FIG. 1(B), by using the formed resist film 5 as a mask, the $SiO_2$ film 4 and the polycrystalline Si film 3 are both processed by anisotropic etching in sequence to remove the resist film 5. After that, the polycrystalline Si film 3 is etched back by isotropic etching to form a recessed portion 6 with a recession of about 100 nm, for instance. As a method of forming the recessed portion 6, CDE method (chemical dry etching), wet processing, and the like, are typical. In any method, however, it is possible to form the recessed portion 6 as shown in FIG. 1(B).

Figure 1C:
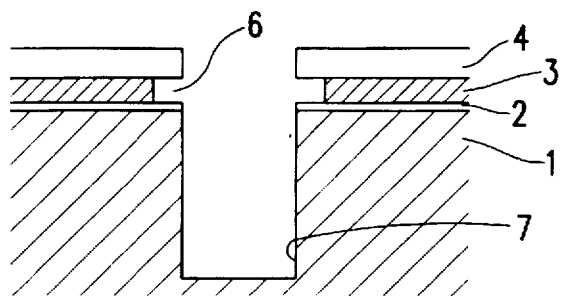

After that, as shown in FIG. 1(C), the $SiO_2$ film 2 is removed, and further the Si substrate 1 is etched to form an element separating trench 7 with a depth of about 500 nm (so that a buried element separating region can be formed later). Further, in this process, when the $SiO_2$ film 2 is removed, although the $SiO_2$ film 4 (used as a mask for etching the Si substrate 1) is also etched simultaneously, since the film thickness (10 nm) of the $SiO_2$ film 2 is sufficiently thinner than that (200 nm) of the $SiO_2$ film 4 (used as an etching mask), the thickness of the $SiO_2$ film 4 can be almost maintained.

Figure 1D:
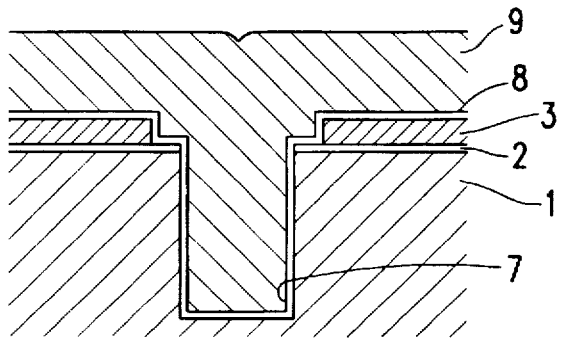

Next, as shown in FIG. 1(D), after the $SiO_2$ film 4 has been removed by use of an $NH_4F$ solution, a $SiO_2$ film 8 with a thickness of about 20 nm is formed by thermal oxidization in order to remove defects produced on the Si substrate 1 when the Si substrate 1 is etched.

After that, another $SiO_2$ film 9 with a thickness of about 1 μ, for instance, is further deposited thereon by chemical vapor deposition method as a filling substance of the element separating trench 7 (as a buried element separation).

Figure 1E:
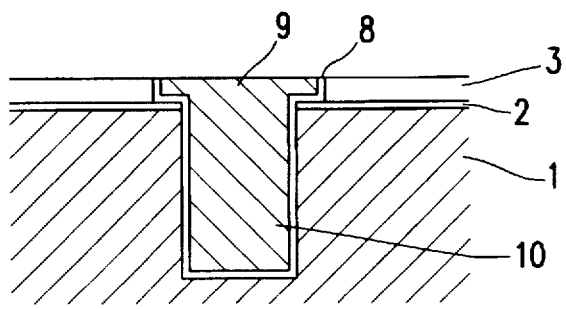

After that, as shown in FIG. 1(E), the deposited filling substance of $SiO_2$ film 9 is etched back by anisotropic etching or polishing by use of the polycrystalline Si film 3 as a stopper film, the etching of the filling substance $SiO_2$ film 9 can be stopped at a level flush with the polycrystalline Si film 3 to form the buried element separating region 10.

Figure 1F:
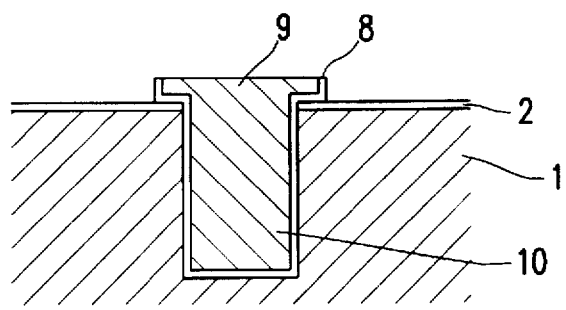

Further, as shown in FIG. 1(F), the polycrystalline Si film 3 used as a stopper during the etching back is removed to complete the buried element separating region 10.

Figure 1G:
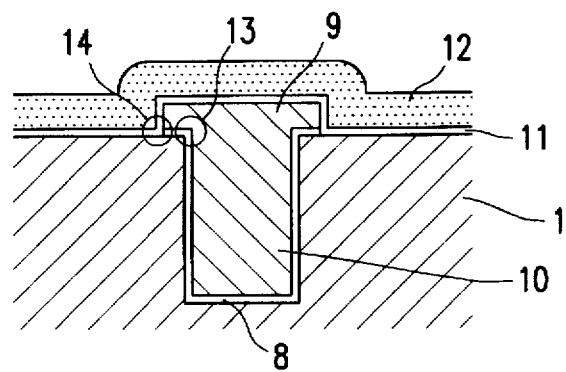

Finally, as shown in FIG. 1(G), a polycrystalline Si film 12 is deposited all over the device to complete the semiconductor device.

The buried element separating region 10 formed in accordance with the above-mentioned method is of concave shape. In addition, since the edge portion 13 of the Si substrate 1 is covered with the $SiO_2$ film 9 for filling the buried element separating trench 7, it is possible to eliminate electric field concentration and defects at the corner thereof, so that it is possible to realize an LSI of high reliability.

Further, in the above-mentioned first embodiment, the $SiO_2$ film 4 is used as a mask for etching the Si substrate 1 to form the element separating trench 7, and the polycrystalline Si film 3 is used as an etching stopper film when the filling substance of the buried element separating region 10 is etched back. Without being limited thereto, however, it is possible to use any other films, as long as the etching mask (used when the Si substrate 1 is etched to form the element separating trench 7) and the etching stopper (used when the filling substance is etched back) are different from each other. For instance, a WSi film, TiN film, carbon film, SiN film, and the like, are usable as the etching stopper.

Further, in this first embodiment, $SiO_2$ is used as the substance for filling the buried element separating trench 7. Without being limited only thereto, it is of course possible to use other filling substances such as Si, SiN, and the like.

Further, when Si is used as the filling substance, $SiO_2$ film and SiN film can be used as the polycrystalline Si film 3 and the $SiO_2$ film 4, both shown in FIG. 1(A), or vice versa.

Further, in the first embodiment, the polycrystalline Si film 3 and the $SiO_2$ film 4 are deposited in sequence; these films 3 and 4 are etched by use of a resist film 5 formed into a predetermined shape as a mask; and the $SiO_2$ film 4 is used as a mask to etch the element separating trench 7. However, it is possible to realize the same structure even when the $SiO_2$ film 4 is not deposited.

[Second embodiment]

Figure 2A:
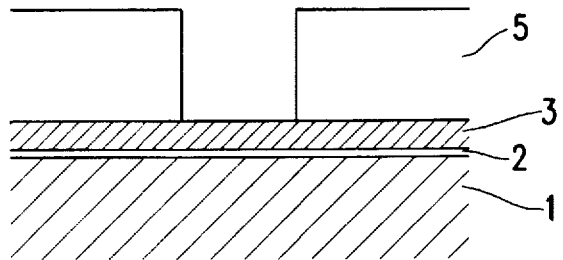
FIGS. 2(A) to 2(G) are cross-sectional views for assistance in explaining a second embodiment of the method of manufacturing semiconductor devices.
Figure 2B:
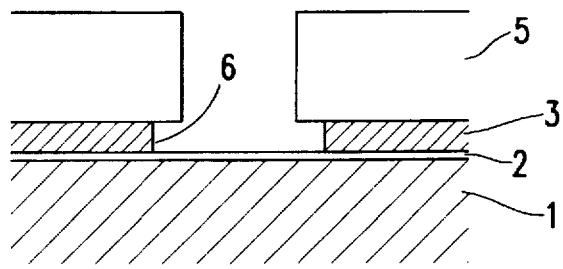
Figure 2C:
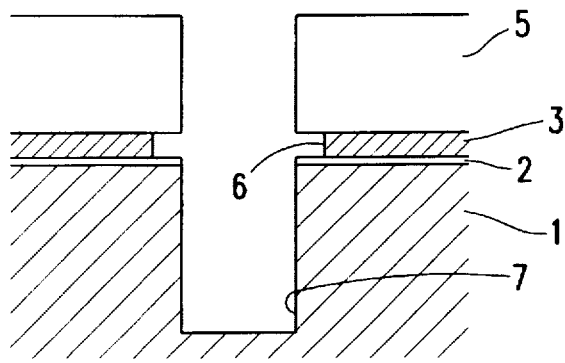

FIGS. 2(A) to (C) show a second embodiment of a manufacturing method according to the present invention, which is described from the above-mentioned point of view.

First, as shown in FIG. 2(A), a $SiO_2$ film 2 with a thickness of about 10 nm, for instance is formed on a Si substrate 1 by thermal oxidization. Then, a polycrystalline Si film 3 with a thickness of about 200 nm, for instance, is deposited by chemical vapor deposition. Further, a resist film 5 is applied thereon and formed into a predetermined shape in accordance with photolithography.

Further, as shown in FIG. 2(B), by using the formed resist film 5 as a mask, the polycrystalline Si film 3 is processed by anisotropic etching, and further etched by isotropic etching to form a recessed portion 6 with a recess of about 100 nm. As a method of forming the recessed portion 6, COB method (chemical dry etching), wet processing, and the like are known. In any method, however, it is possible to form the recessed portion 6 as shown in FIG. 2(B).

After that, as shown in FIG. 2(C), the $SiO_2$ film 2 is removed to expose the surface of the Si substrate 1, and the exposed Si substrate 1 is etched to a depth of about 500 nm (sufficient depth as the buried element separation) by use of the resist film 5 as a mask to form an element separating trench 7.

Figure 2D:
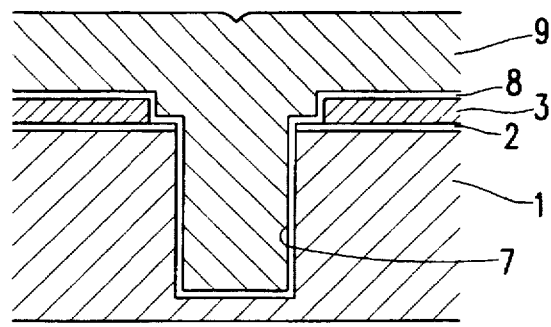
Figure 2E:
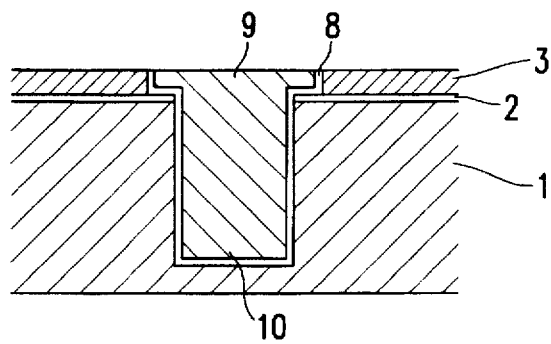
Figure 2F:
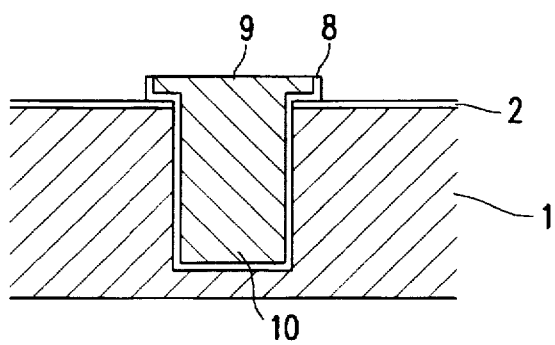
Figure 2G:
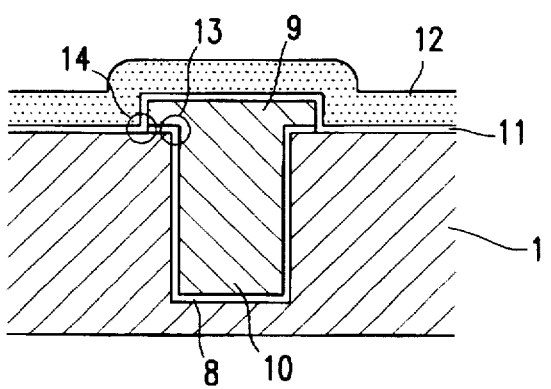

After that, as shown in FIG. 2(D) the resist film 5 removed and the process shown in FIGS. 2(D) to 2(G) is conducted in the same way as with the case of the first embodiment to obtain the semiconductor device.

As described above, in the above-mentioned embodiments, as shown in FIG. 1(F), after the buried element separating region 10 has been completed, ions are implanted to control the threshold level to a predetermined value; after the SiO$_2$ film 2 and the SiO$_2$ film 8 above the surface of the Si substrate 1 have been removed, a gate oxide film 11 with a thickness of about 10 nm is formed by thermal oxidization; and after that, a polycrystalline Si film 12 with a thickness of about 300 nm, for instance is deposited and formed into a predetermined shape as a gate electrode. The device thus obtained is shown in FIG. 1(G).

Figure 3A:
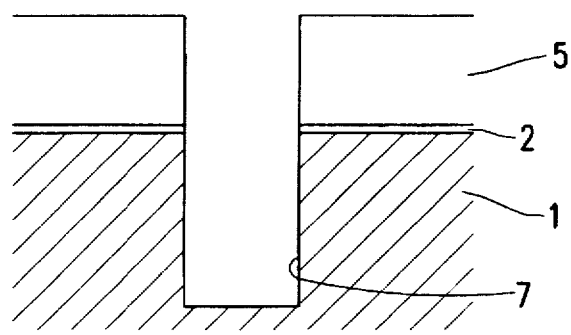
FIGS. 3(A) to 3(D) are cross-sectional views for assistance in explaining a conventional method of manufacturing semiconductor devices.
Figure 3B:
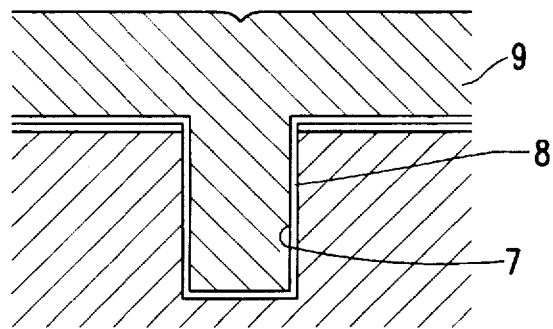
Figure 3C:
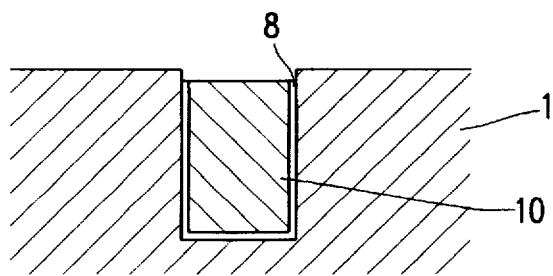
Figure 3D:
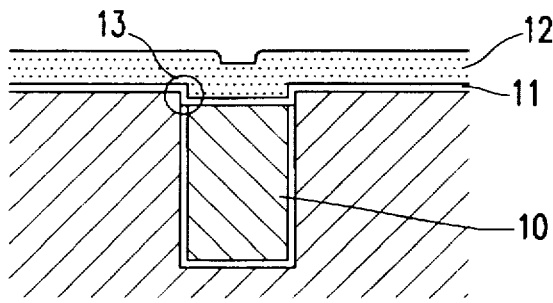
Figure 4:
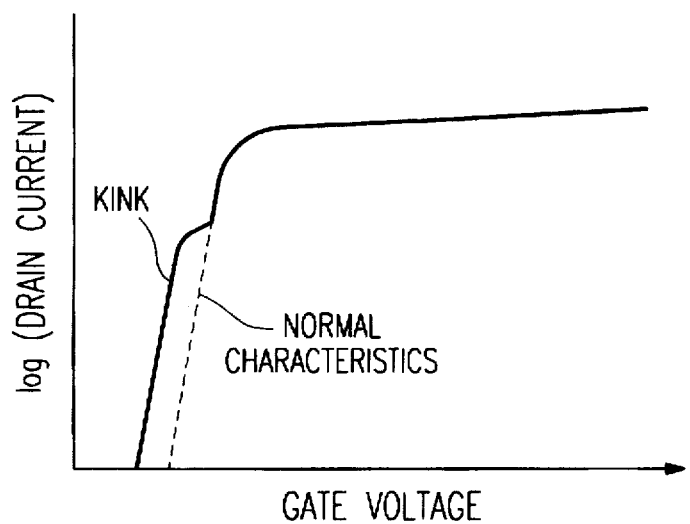
FIG. 4 is a graph of I–V characteristics of the semiconductor device formed in the conventional manufacturing method.

When the structure shown in FIG. 1(G) is compared with that shown in FIG. 3(D), since the edge portion 14 is formed into a concave shape as shown in FIG. 1(G), it is possible to solve the problem with the kink characteristics of the MOSFET caused by the electric field concentration at the edge portion 13 of the buried element separating region 10 in the conventional semiconductor device.

Further, in the conventional semiconductor device shown in FIG. 3(D), since the edge portion 13 is located at the corner of the Si substrate 1, a mechanical stress tends to be concentrated and thereby a defect easily occurs, so that a problem arises in that the gate oxide film leaks. In contrast with this, in the semiconductor device of the present invention as shown in FIG. 1(G), since the edge portion 14 of the buried element separating region 10 is formed away from the corner of the Si substrate 1, it is possible to prevent a defect from being produced at the edge portion 13 and thereby to solve the problem related to the gate oxide film leakage.

Further, it is also possible to use a Si nitride film instead of the SiO$_2$ films 2, 4 and 8. Further, it is also possible to use both the SiO$_2$ film and Si nitride film in combination.

Further, the SiO$_2$ film 2 can be replaced with a carbon film, TiN film, or siliside metal, and the like. Further, the SiO$_2$ film 4 can be replaced with Si oxide film, Si nitride film, Si film, or resist film, etc. Further, the SiO$_2$ film 8 can be replaced with Si oxide film, Si nitride film, or Si film.

As described above, in the method of manufacturing the semiconductor device according to the present invention, after materials are deposited in sequence on the substrate, a part of the material is recessed in the horizontal direction along the surface of the substrate to form a recessed portion; after that, an element separating trench is formed; another material is deposited; and the whole device is etched back. Therefore, since a convex buried element separating region 10 can be formed and in addition since the edge portion of the substrate can be covered with the element separating region filling material, it is possible to prevent the electric field from being concentrated at the corner portion of the substrate and to prevent a defect from occurring at the corner portion of the substrate, thus providing a miniaturized semiconductor device of higher reliability.

In summary, according to the present invention, since the edge portion of the element separating trench formed in the semiconductor substrate can be covered with the trench filling material, it is possible to provide a semiconductor device which can suppress electric field concentration at the edge portion of the substrate and thereby to prevent the defect from being produced at the edge portion thereof.

What is claimed is:

1. A method of manufacturing a semiconductor device, the method comprising the steps of:

forming a first material layer and a second material layer in sequence on a surface of a semiconductor substrate;

forming a first opening in the second material layer and a second opening in the first material layer, the second opening being larger than the first opening by isotropically etching back said first material layer;

forming an element separating trench under the first opening in the substrate by using the second material layer as a mask;

removing the second material layer;

depositing a filling material on the element separating trench, the substrate and the first material layer, the depositing step being performed after the removing step; and etching back the filling material by using the first material layer as a stopper.

2. The method of manufacturing a semiconductor device of claim 1, including the steps of:

removing the first material layer; and depositing a third material layer on the filling material and the substrate.

3. The method of manufacturing a semiconductor device of claim 1, including the step of forming a first insulating layer between the substrate and the first material layer.

4. The method of manufacturing a semiconductor device of claim 1, wherein the filling material is deposited on a first insulating layer.

5. The method of manufacturing a semiconductor device of claim 3, wherein the filling material is deposited on a second insulating layer.

6. The method of manufacturing a semiconductor device of claim 2, wherein the third material layer is deposited on a first insulating layer.

7. The method of manufacturing a semiconductor device of claim 2, wherein the first material layer is selected from the group consisting of a polycrystalline silicon layer, a SiO$_2$ layer, and a SiN layer; the second material layer is a resist film; the third material layer is a polycrystalline silicon film; and the filling material is selected from the group consisting of a SiO$_2$ film and a Si film.

8. The method of manufacturing a semiconductor device of claim 7, wherein the first material layer is said SiO$_2$ layer and the filling material is said SiO$_2$ film, and including the step of forming a first insulating layer between the substrate and the first material layer.

9. The method of manufacturing a semiconductor device of claim 7, wherein the first material layer is said SiN layer and the filling material is said SiO$_2$ film.

10. A method of manufacturing a semiconductor device, the method comprising the steps of:

forming a first material layer, a second material layer, and a third material layer in sequence on a surface of a semiconductor substrate;

patterning the third material layer;

etching the second and the first material layers by using the third material layer as a first mask to form a first opening in the second material layer and a second opening in the first material layer, the second opening being larger than the first opening by isotropically etching back said first material layer;

removing said third material layer;

forming an element separating trench under the first opening in the substrate by using the second material layer as a second mask;

removing the second material layer;

depositing a filling material on the element separating trench, the substrate and the first material layer, the depositing step being performed after the second material layer has been removed; and etching back the filling material by using the first material layer as a stopper.

11. The method of manufacturing a semiconductor device of claim 10, including the steps of:

removing the first material layer; and depositing a fourth material layer on the filling material and the substrate.

12. The method of manufacturing a semiconductor device of claim 10, including the steps of forming a first insulating layer between the substrate and the first material layer.

13. The method of manufacturing a semiconductor device of claim 10, wherein the filling material is deposited on a first insulating layer.

14. The method of manufacturing a semiconductor device of claim 12, wherein the filling material is deposited on a second insulating layer.

15. The method of manufacturing a semiconductor device of claim 11, wherein the fourth material layer is deposited on a first insulating layer.

16. The method of manufacturing a semiconductor device of claim 11, wherein the first material layer is selected from the group consisting of a polycrystalline silicon layer, a $SiO_2$ layer, and a SiN layer; the second material layer is selected from the group consisting of a first $SiO_2$ film and a SiN film; the third material layer is a resist film; and the filling material is selected from the group consisting of a second $SiO_2$ film and a Si film.

17. The method of manufacturing a semiconductor device of claim 16, wherein the first material layer is said polycrystalline silicon layer, the second material layer is said first $SiO_2$ film and the filling material is said second $SiO_2$ film, and including the step of forming a first insulating layer of $SiO_2$ film between the substrate and the first material layer.

18. The method of manufacturing a semiconductor device of claim 16, wherein the first material layer is said polycrystalline silicon layer, the second material layer is a SiN film and the filling material is said second $SiO_2$ film, and including the step of forming a first insulating layer of $SiO_2$ film between the substrate and the first material layer.

* * * * *